(12) United States Patent
Saito

(10) Patent No.: US 6,917,220 B2
(45) Date of Patent: Jul. 12, 2005

(54) SEMICONDUCTOR DEVICE AND A METHOD FOR CHECKING STATE TRANSITION THEREOF

(75) Inventor: Hidetoshi Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/758,360

(22) Filed: Jan. 14, 2004

(65) Prior Publication Data

US 2004/0153626 A1 Aug. 5, 2004

(30) Foreign Application Priority Data

Jan. 29, 2003 (JP) .................................... P2003-019696

(51) Int. Cl.$^7$ .......................................... H03K 19/173
(52) U.S. Cl. ............................ 326/46; 712/32; 700/12
(58) Field of Search ............................ 326/38–41, 46; 327/160, 159; 700/12, 23; 712/32, 34–37

(56) References Cited

U.S. PATENT DOCUMENTS

| | | | |
|---|---|---|---|
| 5,473,531 A | * | 12/1995 | Flora-Holmquist et al. ... 700/12 |
| 5,805,501 A | | 9/1998 | Shiau et al. |
| 5,862,369 A | * | 1/1999 | Parks et al. .................. 713/503 |
| 6,356,974 B2 | | 3/2002 | Chevallier |
| 6,838,918 B1 | * | 1/2005 | Kaviani ...................... 327/160 |

* cited by examiner

*Primary Examiner*—Vibol Tan
(74) *Attorney, Agent, or Firm*—Hogan & Hartson, LLP

(57) ABSTRACT

A semiconductor device includes a state code register that stores a state code representing a present internal state. A state transition logic unit is configured to determine a state code for a next internal state to be transited in accordance with a predetermined logic, based on a state code provided from the state code register and an input command instructing transition to a required state, and to set the determined state code into the state code register with synchronizing an internal clock. An expected value register is configured to hold an internal state to be detected, as an expected value code and a comparing unit compares the state code set in the state code register by the state transition logic unit to the expected value code in the expected value register and supplying an equal state signal when they coincide.

20 Claims, 6 Drawing Sheets

SEMICONDUCTOR DEVICE AND A METHOD FOR CHECKING STATE TRANSITION THEREOF

BACKGROUND OF THE INVENTION

1. Field of the Invention

This application claims the benefit of priority from Japanese Patent Application No. 2003-19696, filed on Jan. 29, 2003 which, is hereby incorporated by reference in its entirety.

The present invention relates to a semiconductor device that includes a state transition mechanism for controlling the transition of an internal state and to a method for checking a state transition thereof. More particularly, embodiments consistent with the present invention relate to a semiconductor device that includes a nonvolatile memory unit to perform an autonomic function for a partial state transition by using a timer circuit and to a method for improving evaluation efficiency of the semiconductor device.

2. Description of Related Art

Generally, it takes a very long time to write or erase the memory cells for a semiconductor device that installs asynchronous type memory cells, such as a nonvolatile memory. Further, during the cell manufacturing processes, large variations are generated in the write and erase characteristics for each of the cells. Consequently, it is required to optimize a write time and an erase time for each of the cells. To do so, a conventional method is known for performing an automatic verification operation after writing or erasing to and from each cell.

FIG. 6 is a flowchart for explaining a conventional writing operation into nonvolatile memory cells in a semiconductor device. The writing operation includes an initializing step 101, a program step 102, a count updating step 1step 103, a verifying step 1step 104, a verification judging step 1step 105, a count judging step 106, a data update step 107, a post-treatment step 108 and an error setting step 109 in order to optimize the writing time for each of the cells.

When a writing command is inputted, at first, a writing address and writing data are loaded and latched at the initializing step 101. At the next program step 102, a writing voltage is supplied to the cell designated by the writing address based on the writing data. That is, an actual writing operation is performed by injecting electrons into a floating gate of the cell. Usually, the writing operation is simultaneously performed on a plurality of cells with units of 8 bits or 16 bits. Generally, it takes 1 to 2 micro-second ($\mu s$) for each of the writing operations.

After updating the writing count at the count updating step 103, the written data is read out at the verifying step 104. The read-out data and the writing data are compared at the verification judging step 105. Since a threshold value of a cell transistor varies due to the injected amount of electrons into the floating gate, when a sufficient amount of electrons has been injected, the value of the read-out data may coincide with the value writing data. On the contrary, if an insufficient amount of electrons were injected, the variation of the threshold value becomes small, and the value of the read-out data does not coincide with the value of the writing data.

In accordance with a result of this comparison, either one of the post-treatment step 108 and the count judging step 106 is selected. That is, if the value of the read-out data and the value of the writing data coincide (step 105, OK), the post-treatment step 108 is selected. If the value of the read-out data and the value of the writing data do not coincide (step 105, NG), the count judging step 106 is selected. For the post-treatment step 108 to be selected, each of the plurality of cells that were simultaneously written to needs to coincide such that each of the bits of the read-out data coincides with each of the bits of writing data. Accordingly, even when a cell does not coincide with just one bit, the count judging step 106 is selected.

The writing operation finishes by returning the voltage given to the cells into the initial condition at the post-treatment step 108.

At the count judging step 106, the writing count executed so far is compared to a predetermined value. If the executed writing count does not exceed the predetermined value (step 106, OK), the data updating step 107 is selected for performing a further electron injection operation. Then, the program step 102 is again repeated. In case the executed writing count exceeds the predetermined value (step 106, NG), the error setting step 109 is selected and the writing operation goes to the post-treatment step 108.

At the data updating step 107, the coincided bit to the write data is selected among the read-out data at the verify step 104. That is, cells that are injected with a sufficient amount of electrons into the respective floating gate are selected and the mask data is updated for preventing a writing operation from executing at the next program step 102. The aim of this step intends to stabilize operations of a circuit, as much as possible, such a read-out operation or an erasing operation by suppressing large variations of each threshold value for each of a cell transistor on each bit.

At the error setting step 109, it is recorded that the writing operation has not correctly finished, that is, the cell data was wrong, by setting an error flag. After that, the writing operation finishes through the post-treatment step 108.

Thus, for the writing operation, the program step 102 is repeated until all of the simultaneous writing cells of 8 bits or 16 bits are correctly wrote, except an error caused by exceeding the count. Consequently, it takes several 10 micro-seconds ($\mu s$) for each of the writing operations. This becomes a defect of a system installed in the semiconductor device since the writing operation takes a longer time than the operation time for another command cycle. Usually it needs for another command cycle taking about 100 nano-seconds (ns). To avoid this, it is usually designed so that the writing operation or the erasing operation can be suspended or stopped during the execution of an external interrupt command. When the operation is suspended, its address and data are stored in a register circuit so that the operation can restart at a later time. Further, in order to shorten a restarting lead time for inputting another command after the operation has been suspended by receiving an interrupt command, each of the steps illustrated in FIG. 6 is constructed so as to execute a necessary process for responding to such an interrupt command. Thus, to control such complicated operations, each step includes an internal state transiting mechanism so as to respond to an interrupt command in a shorter lead time, even when the interrupt command has been input at any time.

Meanwhile, it is a serious problem for evaluating such a condition of the semiconductor device to confirm all of the changes of the operations due to an interrupt command. Thus, even when an interrupt command occurs at any time during the several 10 $\mu s$, it must be guaranteed for the semiconductor device to operate correctly. Particularly, this is a serious problem for such a semiconductor device that allows asynchronous input of an external signal, because it needs to take an extensive amount of time to perform an evaluation and a failure analysis.

In an evaluation method that inputs an interrupt command by simply shifting timings, it is required for a writing operation to take an evaluation time of several 100 times to several 1,000 times. Actually, it is almost impossible to evaluate entire combinations of commands at all of the timing. Further, the evaluation method requires a failure reproduction, a failure analysis, or more particularly an internal signal wave observation to observe a signal wave that is only several nano-seconds (ns) among several 10 micro-seconds (10 $\mu$s). It is seriously difficult to generate trigger signals for this observation.

Moreover, it takes much longer for an erasing operation than for a writing operation. Usually, it takes about one second for every erasing operation. Thus, it becomes much more difficult for the erasing operation to perform such an evaluation or a failure analysis as mentioned above. As explained above, the conventional semiconductor device has serious problems for evaluating or analyzing interrupt commands during a writing operation or an erasing operation into nonvolatile memory cells. Thus, it takes an extensive amount of time to perform an evaluation or a failure analysis.

SUMMARY OF THE INVENTION

The present invention intends to solve the above-mentioned problems. Accordingly, the present invention provides a semiconductor device and a checking method thereof for easily evaluating and analyzing the state transition by a state transition control mechanism. A semiconductor device and a state transition checking method consistent with the invention may efficiently evaluate and analyze state transitions, since the state transition control mechanism supplies an equal state signal when a state has transited to a required internal state.

Consistent with the present invention, there is provided semiconductor device including a state code register for storing a state code representing a present internal state and a state transition logic unit configured to determine a state code for a next internal state to be transited in accordance with a predetermined logic, based on a state code provided from the state code register and an input command instructing transition to a required state, and to set the determined state code into the state code register with synchronizing an internal clock. The semiconductor device also includes an expected value register configured to hold an internal state to be detected, as an expected value code and a comparing unit configured to supply an equal state signal by comparing the state code set in the state code register by the state transition logic unit to the expected value code in the expected value register and when they coincide.

Also consistent with the present invention, there is a provided a state transition checking method for use with a semiconductor device, including determining a state code for a next internal state to be transited in accordance with a predetermined logic, based on a state code indicating a present internal state and a command instructing to transit to a required state setting the determined state code into a state code register, with synchronizing an internal clock and setting an internal state to be detected into an expected value register as an expected value code. The state transition method also includes comparing the state code set into the state code register with the expected value code set into the expected value register and outputting an equal state signal when the state code coincides with the expected value code.

DETAILED DESCRIPTION OF THE PREFERRED EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

As an exemplary embodiment, a state transition control mechanism consistent with the present invention will be explained by using a writing operation for a nonvolatile memory device and an interrupt command "program suspend" (hereinafter simply referred to as a "PSUS") that is one of the interrupt commands for the nonvolatile memory device. In order to simplify the explanation, circuit block diagrams relating to a memory cell unit and its operations are omitted since they are substantially the same as usual nonvolatile memory devices.

Figure 1:
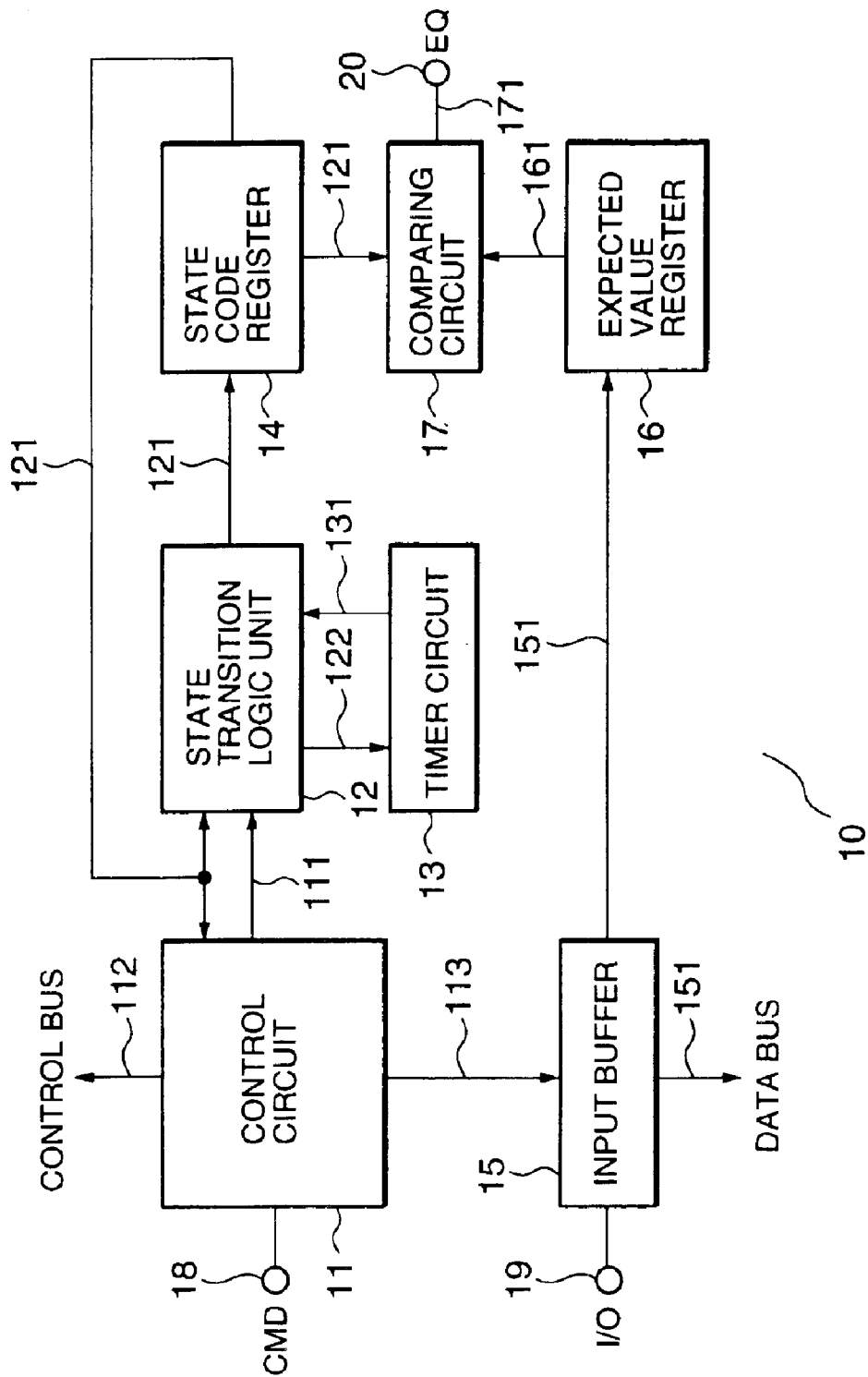
FIG. 1 is a block diagram illustrating an exemplary configuration for an embodiment of a semiconductor device in which methods and apparatus consistent with the present invention may be implemented.

FIG. 1 illustrates a semiconductor device 10 consistent with the invention. The semiconductor device 10 includes a control circuit 11 for generating a command or a control signal in accordance with a received external signal, a state transition logic unit 12 for determining a next internal state based on a present internal state or an input command, a timer circuit 13 for counting a residence period at the present internal state, a state code register 14 for holding the internal state, an input buffer 15 for holding external input data, an expected value register 16 for holding an expected value register 16 to be detected, and a comparing circuit 17 for generating a equal state signal after comparing the present internal state and the expected value.

The control circuit 11 includes a control input terminal CMD 18 for inputting a command. Based on the input command, the control circuit 11 generates an instruction command 111 for designating an expected internal state transition and provides the instruction command 111 to the state transition logic unit 12. Further, the control circuit 11 generates control signals 112 necessary to control circuit block diagrams in the semiconductor device 10, such as the state transition logic unit 12 and the input buffer 15 based on the present internal state and the input command. The control signals 112 are supplied to the respective circuit block diagrams through a control bus.

The state transition logic unit 12 determines a next internal state during a next cycle of the internal clock based on the present internal state, a command received from the control circuit 11 and a count value received from the timer circuit 13. The determined internal state is provided to the state code register 14 as a state code 121. Further, when a new internal state has been transited, the state transition logic unit 12 informs a predetermined residence period for the new internal state, i.e., a cycle number 122 for the internal clock, to the timer circuit 13.

The internal state means a concept for identifying a logic status for the entire peripheral logic circuits that vary its logic status synchronized with the internal clock, based on a state code determined by the state transition logic unit 12. They are uniquely identified by a predetermined state code. In the concept of this internal state, not included are an analogical operation status in peripherals around a memory cell, a status of a logic circuit that does not synchronize to the internal clock, or a status of a circuit that directly operates with asynchronous inputs. Thus, for example, a threshold value of a memory cell, a voltage level of a word line, a high voltage generating circuit and an internal step-down circuit, or a high impedance of an output, are not included.

When a new internal state has been transited, the timer circuit 13 receives a residence period 122 for the new internal state from the state transition logic unit 12, as a cycle number 122 of the internal clock. The timer circuit 13 feeds back a count value 131 that is counted down from the received cycle number 122 synchronized with the internal clock, to the state transition logic unit 12. This residence period setup operation for an internal state by the timer circuit 13 is an inevitable function for the semiconductor device consistent with the invention, since it takes a long time for such a semiconductor device including a memory unit including nonvolatile memory cells to perform a writing operation or an erasing operation into the nonvolatile memory cells.

The state code register 14 holds a present state code 121 received from the state transition logic unit 12 synchronized with the internal clock. The state code register 14 feeds back the present state code 121 to the state transition logic unit 12 and also outputs it to the control circuit 11 and the comparing circuit 17.

The input buffer 15 includes a data input terminal I/O 19. The input buffer 15 takes in the input data in accordance with a signal 113 from the control circuit 11. Further the input buffer 15 outputs the data to the expected value register 16, as an expected value 151. The expected value is the same value with the state code. The expected value is inputted externally under a predetermined process by an evaluator. Normal writing data also uses the same data input terminal I/O 19 and the input buffer 15. These normal writing data 151 are supplied to a data bus by the control circuit 11.

The expected value register 16 holds the expected value 161 received from the input buffer 15 and provides it to the comparing circuit 17. The comparing circuit 17 receives both the state code 151 held in the state code register 14 and the expected value 161 held in the expected value register 16 and compares them. When they coincide, the comparing circuit 17 outputs an equal state signal through an output terminal EQ 20.

Figure 2:
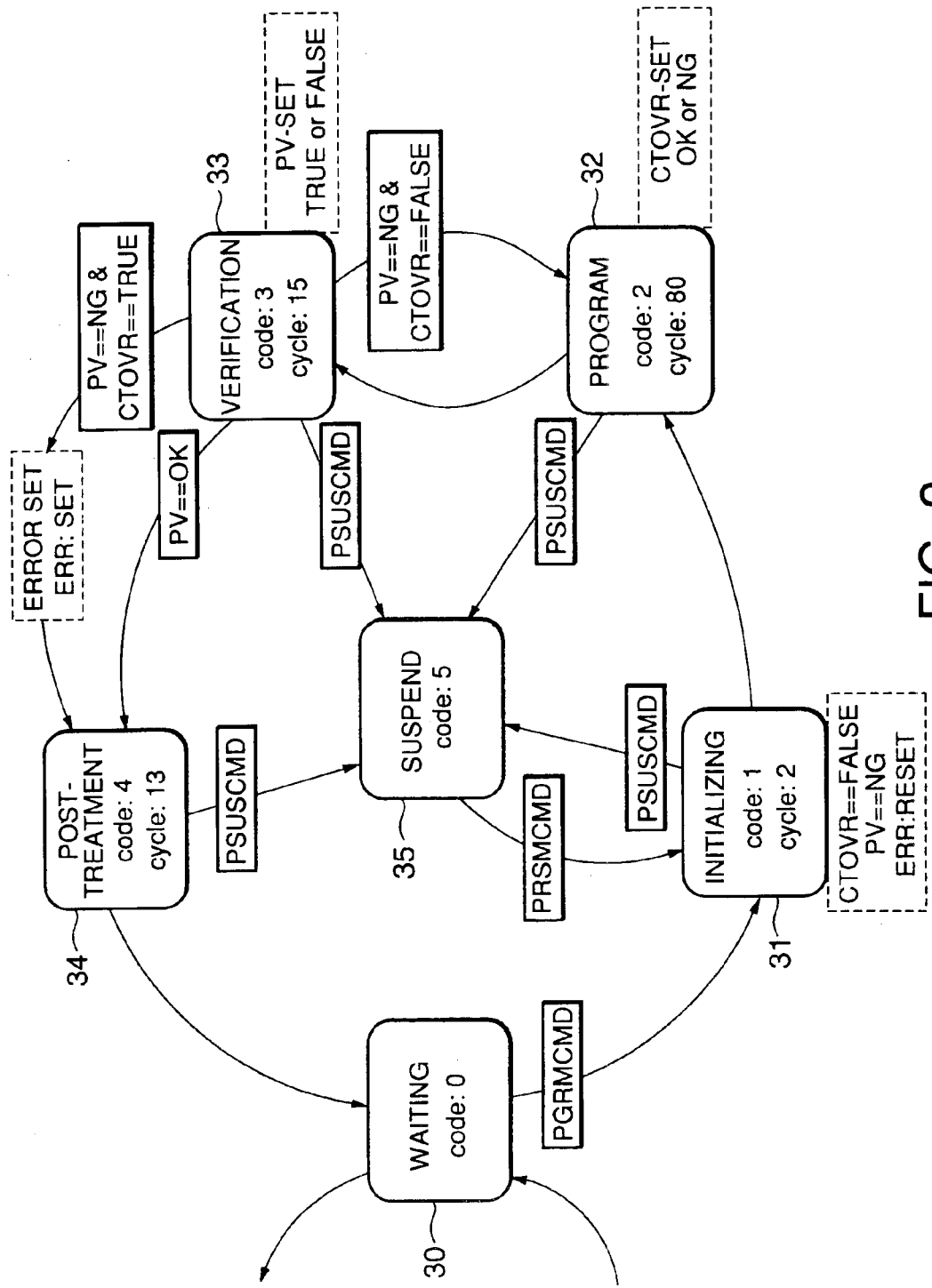
FIG. 2 is a state transition table for explaining the embodiment of a semiconductor device as illustrated in FIG. 1.

FIG. 2 explains such an operation of the state transition controlling mechanism, for example, a writing operation into a memory cell unit by using the PSUS command. In FIG. 2, each box represents a respective internal state that is respectively allotted a state code and a residence period, i.e., a cycle. Further, an arrow represents a state transition and a label attached to an arrow indicates a condition of a command which causes the state transition or the state flag.

Control circuit 11 generates a command 111 based on an input command into the control input terminal CMD 18. Each state flag is a collection of flags having a plurality of bits, and is set up and released as a result of an operation at the internal state.

An arrow attached to no label indicates an autonomously generated state transition by a count value of the timer circuit 13 when the residence period at the internal state passes. That is, it means that the internal state is automatically transited when the count value becomes "0 (zero)".

The transition of the internal state is preliminarily determined to have an order of priority. That is, it is the order of a transition by a command, a transition by a state flag, and a default transition by a count value. Thus, at first, the state transition logic unit 12 examines whether a command from the control circuit 11 exists, with synchronizing internal clocks. If a command defining a transition at a present internal state has been input, the state transition logic unit 12 provides its internal state for the transition point to the state code register 1register 14, as a next state code.

If a command defining a transition at a present internal state has not been input, state transition logic unit 12 examines a count value from the timer circuit 13. When the count value has not reached "0 (zero)", this indicates that the residence period for the internal state has not yet passed. Accordingly, the state transition logic unit 12 provides the present state code to the state code register 14, as a next state code.

If the count value becomes "0 (zero)", the state transition logic unit 12 examines the content of the state flag. If the content coincides with a flag being defined, transition at the internal state and its value, the state transition logic unit 12 provides a state code for the transition point to state code register 14. If there is no input of a defined command input, and the state flag also does not meet the transition conditions, the state transition logic unit 12 finally provides a predetermined point for the default transition to the state code register 14, as a next state code.

As illustrated in FIG. 2, the operations regarding the internal state include a waiting state 30, an initializing state 31, a program state 32, a verification state 33, a post-treatment state 34 and a suspend state 35. A state code "0 (zero))" is allotted for the waiting state 30 in order to indicate a waiting state of a command input. Further, a residence period is not defined for the waiting state 30 in order to indicate that the present status continues until a command has been input. Thus, a transition point of a default means a certain thing by itself. When a writing command "PGRMCMD" from the control circuit 11 is received at the waiting state 30, the state transition logic unit 12 operates so as to transit to the initializing state 31.

The initializing state 31 performs a preparation for a writing operation in advance to an actual writing operation into memory cells. For the initializing state, a state code "1" is allotted, and a residence period "2" is also allotted. At this state, writing preparation operations, such as a write masking and an initialization of state flag, are performed. Practically, writing mask data into memory cells are reset, error flag "ERR" is reset, a verification flag "PV" is set as "NG", and a writing count flag "CTOVR" is set as a "FALSE". At the initializing state 31, unless the interrupt command "PSUSCMD" is carried out input, the state transition logic unit 12 operates so as to automatically transit to the program state 32 when the internal clock goes through 2 cycles.

The program state 32 actually performs writing operations into memory cells. For the program state 32, a state code "2" is allotted, and a residence period "80" is also allotted. When a first write time has passed and the writing operation into memory cells has finished, a writing counter is counted up.

As explained later, if the verification state 33 judges that writing operation into memory cells has insufficiently finished, the operation transits again to the program state 32 for performing re-writing operation into the same memory cells. Further, the writing counter is counted up. By repeating this operation, if the count value in the writing counter excesses over a preliminarily program count, a state flag "CTOVR" is set to "TRUE". This means that a writing operation during more than a predetermined time has failed due to, such as defects of memory cells.

At the program state 32, unless a command "PSUSCMD" has not been input, the state transition logic unit 12 operates so as to automatically transit to the verification state 33 when the internal clock passes over 80 cycles. The verification state 33 performs read-out operation of data that has written into memory cells at the latest program state 32 in order to examine whether a threshold value of a cell transistor has sufficiently varied. For the verification state 33, a state code "3" is allotted, and a residence period "15" is allotted. The reading-out is accomplished by simultaneously performing for 8 bits or 16 bits. When all of these every bits coincide with write data, a state flag "PV" is set as "OK".

If the "PSUSCMD" command has not input to the state transition logic unit 12 and the residence period also has exceed, the state flag "PV" is examined first. If the state flag "PV" is "OK", it is operated so as to transit to the post-treatment state 34. On the contrary, in case of that the state flag "PV" is "NG", a state flag "CTOVR" is examined. If the state flag "CTOVR" is "FALSE", mask data is again set up in order to perform a writing operation into the memory cell, and the operation transits to the program state. Here, mask data indicate actual writing bits for the program state 32. The coincided bits with the write data at the verification state 33 are set-up so as to prevent from writing into actual memory cells.

When the state flag "PV" becomes "NG" and the state flag "CTOVR" becomes "TRUE" at the verification state 33, the state transition logic unit 12 may set up an error flag as "ERR", and operates so as to transit to the post-treatment state 34. The error flag "ERR" indicates that writing operation could not perform even if beyond a predetermined time period. Thus, it indicates that the memory cells at least corresponding to this write address can not be used in anymore.

The post-treatment state 34 performs post-treatments, such that word lines turns back from a writing level to an ordinal level. For the post-treatment state 34, a state code "4" and a residence period "13" are allotted. At the post-treatment state 34, unless a command "PSUSCMD" is input, the state transition logic unit 12 operates so as to automatically transit to the waiting state 30 when the internal clock exceeds 13 cycles. Thus, a series of writing operation started with an input of the command "GRMCMD" is completed. The "PSUSCMD" command has been input to the initializing state 31, the program state 32, the verification state 33 and the post-treatment state 34, the state transition logic unit 12 operates so as to transit to the suspend state 35. A state code "5" is allotted for suspend state 35. During this state, any memory cells including at the present write address can be read out. Further, if the program resume command "PRSMCMD" is input at suspend state 35, it can return to the initializing state 31 for the writing operation.

In a semiconductor device having such an above explained construction, an evaluation of the writing operation will be explained by supposing that the expected value "2" is set in the expected value register 16. At first, expected value "2" is supplied to the data input terminal I/O 19. When an expected value setting command is input to the control input terminal CMD 18, the control circuit 11 sets the expected value "2" to the expected value register 16 through the input buffer 15. Next, if an automatic program command is input to the input control input terminal CMD 18, the control circuit 11 receives the command. At the same, after latching a write address and write data internally, the control circuit 11 issues a writing command "PGRMCMD" to the state transition logic unit 12. When the writing command "PFRMCMD" receives, the state transition logic unit 12 updates the content of the state code register 14 one by one in accordance with the state transition table illustrated in FIG. 2. That is, it operates so as to perform transition from waiting state 30 to initial condition 31, and further transit to program state 32 after passing 2 cycles.

Under this program state 32, both of the contents in the expected value register 16 and in the state code register 14 are coincided with the same value. Thus, in accordance with this embodiment, both content become "2". Accordingly, the comparing circuit 17 outputs an equal state signal 171 through terminal EQ 20. By monitoring the equal state signal 171, the internal state becomes possible to be accurately grasped at a timing which reaches to the program state. When the state transition progresses until the verification state 33, the equal state signal will no longer be outputted.

As mentioned above, when a series of the writing operations has been completed and returned to the waiting state 30, the automatic program command is again input to repeat the above mentioned operations. That is, whenever the internal state turns into the program state 32, the equal state signal is outputted. Thus, by inputting the expected value corresponding to a desired internal state, it becomes possible to obtain the equal state signal whenever it goes into the internal state.

According to the above-mentioned embodiment, it becomes possible to obtain an equal state signal corresponding to any internal state. Since it is possible to use the equal state signal as an outer trigger signal, it become possible to easily evaluate and analyze a desired internal state. In particular, it can efficiently evaluate and analyze such a relatively longer operation time for a series of executions as the writing or erasing operations for a semiconductor device having memory units of nonvolatile memory cells.

Figure 3:
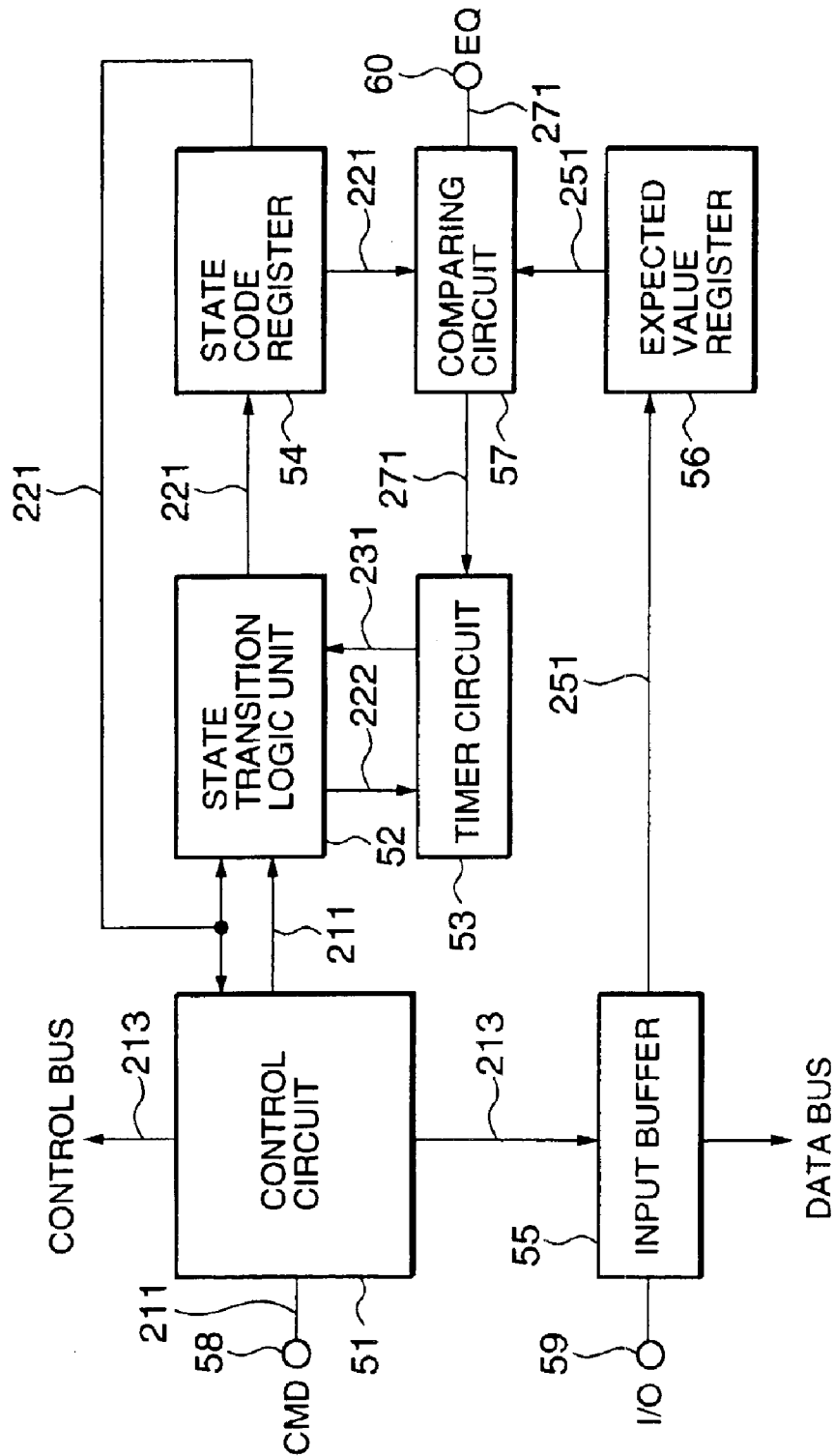
FIG. 3 is a block diagram illustrating another embodiment of a semiconductor device in which methods and apparatus consistent with the present invention may be implemented.

FIG. 3 depicts another embodiment of a semiconductor device consistent with the present invention. This embodiment is also explained as to the state transition control mechanism by using a writing operation for a nonvolatile memory device and a "PSUS" command, similar to the above-mentioned embodiment. Accordingly, the detail explanation of the circuit block diagram and operations relevant to the memory cell unit are omitted, since it is the substantially same as that of general nonvolatile memory devices.

As illustrated in FIG. 3, the semiconductor device of this embodiment consistent with the present invention includes a control circuit 51 configured to generate a command or a control signal 211 by receiving an external signal through an input terminal 58, a state transition logic unit 52 configured to determine a next internal state based on a present internal state and the inputted command 211, a timer circuit 53 configured to count a residence period at the present internal state, a state code register 54 configured to hold a present internal state, an input buffer 55 configured to hold data inputted externally, an expected value register 56 configured to hold an internal state to be detected, and a comparing circuit 57 configured to compare between a present internal state 221 and an expected value 261 and to output an equal state signal 271. For simplifying the explanation, the necessary terms, such as internal state, state code, expected value, are defined as the same as defined in the above-mentioned first embodiment.

The control circuit 51 i1 includes a control input terminal 58 and generates an instruction command 211 for indicating a desired internal state transition based on an input command CMD. The generated instruction command 211 is supplied to the state transition logic unit 52. Further the control circuit 51 generates necessary control signals 213 for each of the circuits in the semiconductor devices, such as the state transition logic unit 52 and the input buffer 55, based on a present internal state and an inputted command. These control signals 213 are respectively supplied to each circuit through such as a control bus.

The state transition logic unit 52 determines an internal state that should be transited at a next cycle of the internal clock, based on the present internal state, a command 211 received from control circuit 51 and a count value 231 from timer circuit 53. The state transition logic unit 52 outputs a determined internal state 221 to the state code register 54 as a state code. Further, the state transition logic unit 52 notifies a predetermined residence period 222 of the internal state to the timer circuit 53 when it transits to a new internal state.

When it transits to a new internal state, the timer circuit 53 receives its residence period for the internal state as a cycle number 222 of the internal clock from the state transition logic unit 52. With counting down the cycle number with synchronizing to the internal clock, the timer circuit 53 feeds back as a count value 231 to the state transition logic unit 52. When the timer circuit 53 receives an equal state signal 271 from the comparing circuit 57, it stops the counting down operation.

The state code register 54 holds a present state code received from the state transition logic unit 52 with synchronizing to the internal clock. The present state code 221 is fed back to the state transition logic unit 52 and it is also supplied to both the control circuit 51 and the comparing circuit 57.

The input buffer 55 includes data input through input terminal I/O 59 for receiving input data in accordance with a signal 213 from the control circuit 51. The input signal is supplied to the expected value register 56 as an expected value. Usual write data is also input through the same data input terminal I/O 59 and the input buffer 55. However, this write data is supplied to the data bus by the control circuit 51. The expected value register 56 holds the expected value 251 received from the input buffer 55 and supplies it to the comparing circuit 57. The comparing circuit 57 receives a state code 221 held in the state code register 54 and a expected value 251 held in the expected value register 56 for a comparison. Only when these two values coincide, the comparing circuit 57 supplies an equal state signal 271 to the timer circuit 53. Further, the equal state signal 271 is output through the terminal EQ 60.

A usual state transition according to the above-mentioned state transition control mechanism of the second embodiment is basically the same to the first embodiment explained in FIG. 2. Accordingly, the detail explanation as to the usual state transition according to this state transition control mechanism is omitted for simplicity. Now, it will be explained as to how to evaluate a writing operation, with an expected value "2" set in the expected value register 56.

Thus, when an expected value "2" is supplied to the data input terminal I/O 59 and an expected value setting command is input to the input terminal CMD 58, the expected value "2" is set in the expected value register 56 by the control circuit 51 through the input buffer 55. Next, when the control circuit 51 receives an automatic program command through the data input terminal CMD 58, it internally latches both a write address and write data, and issues a writing command PGRMCMD 211 to the state transition logic unit 52.

When the state transition logic unit 52 receives the command, it successively updates the contents in the state code register 54 in accordance with the state transition table illustrated in FIG. 2. Thus, when the state transition logic unit 52 receives the writing command PGRMCMD 211, it transits from the waiting state 30 to the initial condition 31. Further, it transits to the program state 32 after passing 2 cycles. At the program state 32, if both contents in the expected value register 56 and the state code register 54, i.e., "2" according to this example, coincide the comparing circuit 57 supplies an equal state signal 271 to the timer circuit 53 and the output terminal EQ 60.

After receiving the equal state signal, the timer circuit 53 stops the counting down operation with synchronizing an internal clock. Accordingly, state transition will factually stop unless the PSUSCMD command is input to the state transition logic unit 52 from the control circuit 51. Thus, when the transition state enters to the program state 32 at first, the state transition logic unit 52 sets a residence period "80" of this state into the timer circuit 53. Next, the timer circuit 53 disables an input of the internal clock by receiving the equal state signal from the comparing circuit 57. Consequently, timer circuit 53 does not execute a counting down operation. Thus, this internal state is kept in the program state 32 unless a PSUSCMD command is input.

Doing this, it becomes possible to stop a state transition at the entered internal state by setting an expected value corresponding to a desired internal state between an initial condition 31 to a post-treatment state 34 into the expected value register 56. Thus, it becomes possible to observe each of the voltage levels for the word lines at that state and each of the logic levels for the respective signal wires by a conventional method, such as a probing. It also becomes possible to repeat the above-mentioned operation by supplying a PSUS command and a resume command to the control input terminal CMD 58 from externally by synchronizing an equal state signal obtained through the output terminal EQ 60, and by issuing a PSUSCMD command and a PRSMCMD command to the control circuit 51.

According to this second embodiment of the invention, it becomes possible to stop the state transition at a desired internal state by inputting an expected value corresponded to an arbitrary internal state. Thus, it can easily confirm a signal level at a desired internal state by a suitable method, such as an internal pin fitting. Especially, this embodiment is very useful for efficiently evaluating and analyzing a consecutive operation having a long execution time, such as a semiconductor device including nonvolatile memory cells. Consequently, this embodiment consistent with the present invention can largely improve efficiency for future development.

In this embodiment, it has been explained that the state transition from a stopped internal state as a result of a comparison to an expected value is executed by a PSUSCMD command. The present invention is not limited to this feature. For example, it is also possible to transit from each of the internal states to a waiting state 30 by newly adding interrupt commands at a test mode.

Figure 4:
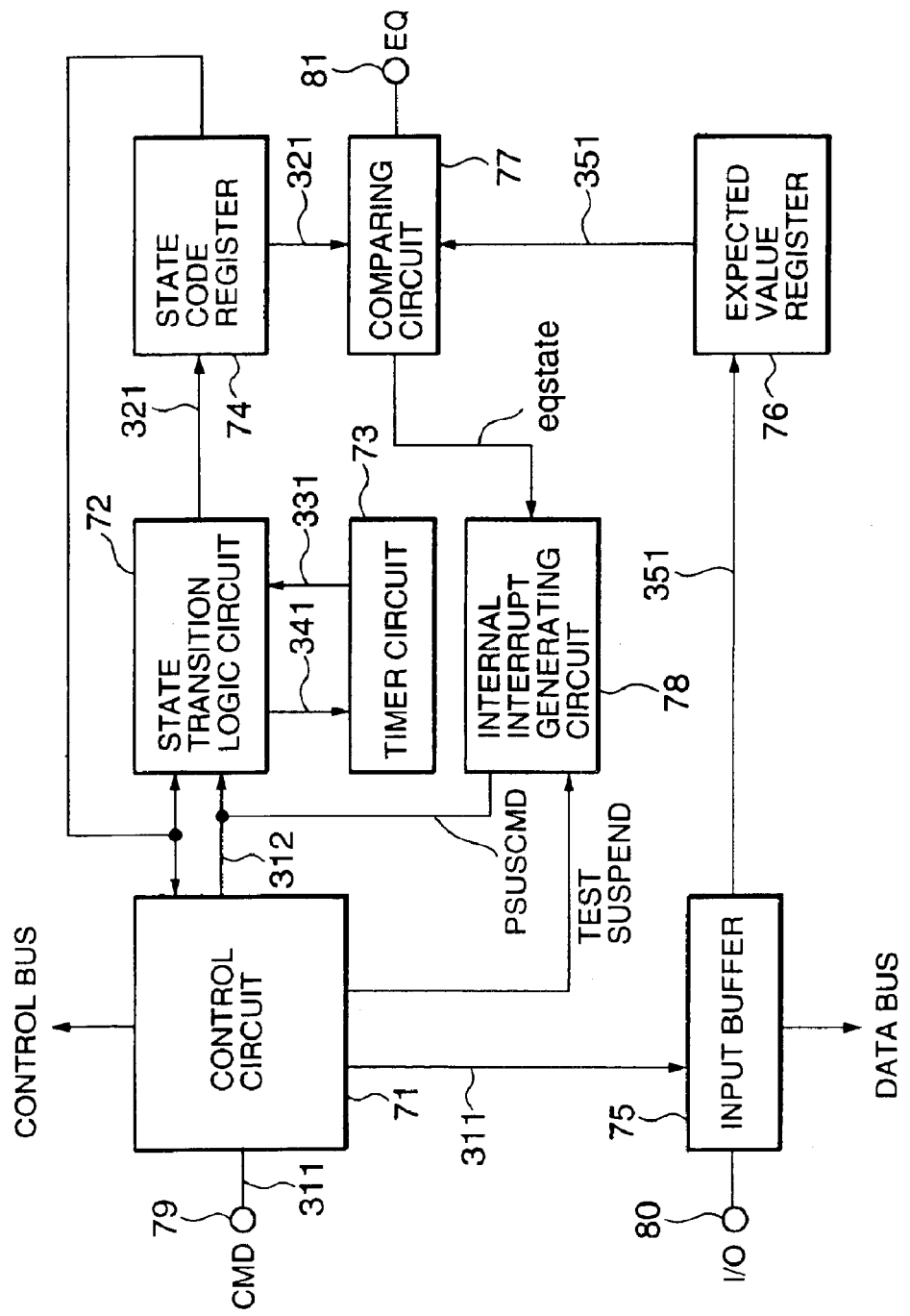
FIG. 4 is a block diagram illustrating further embodiment of a semiconductor device in which methods and apparatus consistent with the present invention may be implemented.

FIG. 4 illustrates a further embodiment of a semiconductor device consistent with the present invention. As similar to the embodiment illustrated in FIG. 1, this embodiment is also explained as that the state transition control mechanism consistent with this embodiment is performed by using a writing operation to a nonvolatile memory device and a PSUS command. The detail explanation for a circuit block diagram and operations for a memory cell are omitted, since these are substantially the same to a commonly used nonvolatile memory device.

As illustrated in FIG. 4, a semiconductor device consistent with the present invention includes a control circuit 71 configured to generate a command or a control signal 312 by receiving an external signal 311, a state transition logic unit 72 configured to determine a next internal state based on a present internal state or the input command 312, a timer circuit 73 configured to count a residence period at a present internal state, a state code register 74 configured to store the present internal state, an input buffer 75 configured to hold data 311 input from an external terminal CMD, an expected value register 76 configured to hold an internal state to be detected, a comparing circuit 77 configured to generate an equal state signal "eqstate" by comparing a present internal state 321 and an expected value 351, and an internal interrupt generating circuit 78 configured to generate an internal interrupt "PSUSCMD" by receiving the equal state signal "eqstate". The terms "internal state", "state code", and "expected value" are the same as explained in the embodiment illustrated in FIG. 1.

The control circuit 71 includes a control input terminal CMD 79 and generates a command 312 based on an input command in order to instruct a desired internal state transition. The instruction command 312 is supplied to the state transition logic unit 72 and the internal interrupt generating circuit 78. Further, the control circuit 71 generates various control signals that are necessary to control each of the circuits in a semiconductor device, such as the state transition logic unit 72, the input buffer 75 and the internal interrupt generating circuit 78, based on the present internal state and the input command 311.

The state transition logic unit 72 determines an internal state to be transited at a next cycle of the internal clock, based on the present internal state, a command 312 received from the control circuit 71 and a count value 331 received from the timer circuit 73. The determined internal state is supplied to the state code register 74 as a state code 321. Further, the state transition logic unit 72 supplies a residence period 341 that is preliminarily determined for a new internal state to the timer circuit 73 when the state has transited to the new internal state.

When the transition has transited into a new internal state, the timer circuit 73 receives a residence period 341 for the new internal state from the state transition logic unit 72, as a cycle number for the internal clock. By counting down the residence period while synchronizing with the internal clock, the timer circuit 73 feeds back a count value 331 to the state transition logic unit 72. The state code register 74 holds a present state code 321 received from the state transition logic unit 72 while synchronizing with the internal clock. The present state code is fed back to the state transition logic unit 72 and also supplied to the control circuit 71 and the comparing circuit 77.

The input buffer 75 includes a data input terminal I/O 80. The input data from the terminal 80 is incorporated into the input buffer 75 in accordance with the signal 311 from the control circuit 71. The incorporated data is concurrently supplied to the expected value register 76 as an expected value. Normal write data also is input to the input buffer 75 through the same data input terminal I/O 80. However, this normal write data is supplied to a data bus by control signals from the control circuit 71. The expected value register 76 holds the expected value 351 received from the input buffer 75, and the expected value is supplied to the comparing circuit 77.

The comprising circuit 77 comprises a state code 321 received from the state code register 74 and an expected value 351 received from the expected value register 76. When both the state code and the expected value coincide, the comparing circuit 77 supplies an equal state signal (hereinafter simply referred to as an "eqstate" signal) to the internal interrupt generating circuit 78. Further, the "eqstate" signal is output through an output terminal EQ 81.

When the "eqstate" signal from the comparing circuit 77 and both of the "TEST" command and "SUSPEND" command from the control circuit 71 have been received, the internal interrupt generating circuit 78 supplies a "PSUSCMD" command to the state transition logic unit 72.

Figure 5:
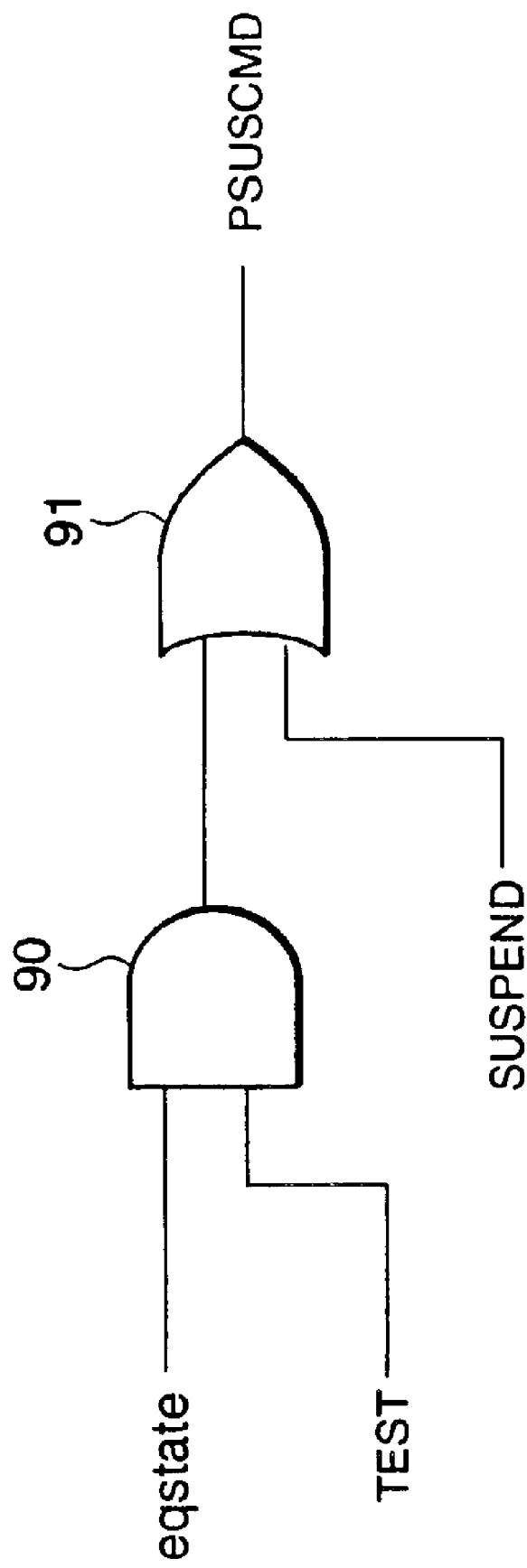
FIG. 5 is a diagram illustrating the internal interrupt generating circuit of the semiconductor device shown in FIG. 4.
Figure 6:
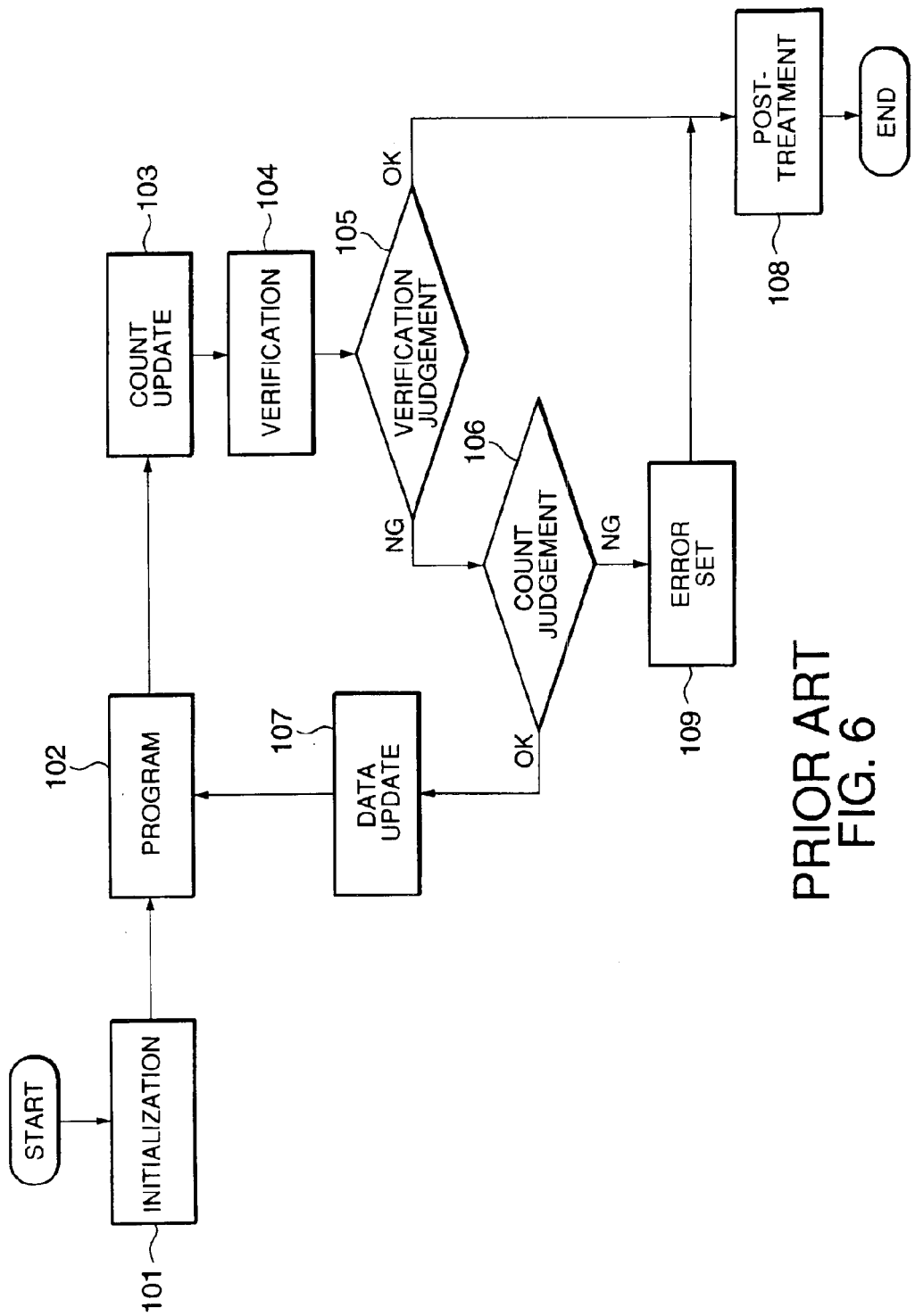
FIG. 6 is a flowchart for explaining a writing operation into nonvolatile memory cells in a conventional semiconductor device.

FIG. 5 illustrates a composition of the internal interrupt generating circuit 78 shown in FIG. 4. Thus, the internal interrupt generating circuit 78 includes an AND gate 90 and an OR gate 91. One input terminal for the AND gate 90 is supplied with the "eqstate" signal from the comparing circuit 77, and the other input terminal of the AND gate 90 is supplied with the "TEST" command from the control circuit 71. An output from the AND gate 90 is supplied to one input terminal of the OR gate 91. The other input terminal of the OR gate 91 is supplied with the "SUSPEND" command from the control circuit 71. An output from the OR gate 91 is supplied to the state transition logic unit 72 as a "PSUSCMD" command.

The "TEST" command is a signal for indicating that a semiconductor device is now operating under a test mode. When a test command is input in the input terminal CMD 79, the control circuit 71 generates the "TEST" command. When a semiconductor device is operating under a normal mode, the "TEST" command is kept at an "L" level. The "SUSPEND" command is generated from the control circuit 71 when the "PSUS" command is supplied to the input terminal CMD 79.

By using the internal interrupt generating circuit 78 shown in FIG. 5, it becomes possible to automatically generate the interrupt command "PSUSCMD" only when the device enters in a test mode in accordance with an internal state preliminary stored in the expected value register 76, while it can operate similar operations as the conventional device during a normal mode. During a normal state transition, the state transition control mechanism of this construction also basically operates substantially the same as the operation explained in FIG. 2.

An evaluation of the write operation is explained when an expected value "2" is set in the expected value register 76. At first, a semiconductor device is entered to a test mode by supplying a test mode setting command to the input terminal CMD 79 for the control circuit 71 illustrated in FIG. 5. At this time, the control circuit 71 puts the "TEST" command at an "H" level.

When the expected value "2" is supplied to the input terminal I/O 80 and the expected value setting command is supplied to the input terminal CMD 79, the control circuit 71 sets the expected value "2" in the expected value register 76 through the input buffer 75. Next, when an automatic program command is supplied to the input terminal CMD 79, the control circuit 71 internally latches both a write address and a write data. Further the control circuit 71 supplies a write command "PGRMCMD" to the state transition logic unit 72. When the write command "PGRMCMD" is received by the state transition logic unit 72, it sequentially updates the content in the state code register 74 in accordance with the state transition table illustrated in FIG. 2. Thus, when the state transition logic unit 72 receives the write command "PGRMCMD", it transits from a waiting state 30 (FIG. 2) to an initial condition 31, and it operates so as to transit to a program state 32 (FIG. 2) after passing 2 cycles.

Under this program state 32, the contents in the expected value register 76 and the state code register 74 i.e., "2" in this example case, coincide. Accordingly, the comparing circuit 77 suplied an "eqstate" signal to the internal interrupt generating circuit 78. By receiving the "eqstate" signal, the internal interrupt generating circuit 78 notifies a generation of an interrupt to the state transition logic unit 72 by putting the "PSUSCMD" command at an "H" level. By receiving the "PSUSCMD" command, the state transition logic unit 72 outputs a state code with synchronizing a next internal clock so as to make the internal state at the suspend state 35. Thus, the internal state transits to the suspend state 35.

At this state, when the expected value register 76 is updated the content to "3" by receiving an output through the output terminal EQ 81 from an external, and the resume command "PRSMCMD" is input, the state transition consecutively progresses from the initializing state 31 to the verification state 33 through the program state 32, and again goes back to the suspend state 35 by the internal interrupt. Thus, by consecutively inputting an expected value corresponded to a desired internal state, it becomes possible to evaluate all of the transition pats from at an arbitrary internal state due to an interrupt command without inputting an external interrupt command.

According to the above-explained further embodiment, it becomes possible to simulate a state transition due to an interrupt from a desired internal state by inputting an expected value corresponded to an arbitrary internal state between the initial condition 31 and the post-treatment state 34 without inputting an interrupt command externally. Consequently, an efficiency of development can be largely improved, since it becomes possible to efficiently evaluate the state transition path.

In the above-explained embodiments, a writing operation for a semiconductor device having a nonvolatile memory cells is used as an example. However, the present invention is not limited to such a type of semiconductor device but also can be applied to another type of semiconductor device having a state transition mechanism and at least one portion of the state transition being automatically performed by, for example, an internal timer circuit. Further, the dividing method of the internal state is not restricted to such a division illustrated in FIG. 2.

Further, the embodiments use a state code to be detected as an expected value. It is also possible to add a count value of a timer circuit to be detected. By doing so, it can output an equal state signal, not only at a time when it enters to a desired internal state but at a time when a certain residence period has passed from it entered to the desired internal state. It is also possible to limit an output of an equal state signal from the comparing circuit at the test mode in order to keep compatibility to a conventional semiconductor device.

As explained above, the described semiconductor device and method for checking a state transition consistent with the present invention may efficiently evaluate and analyze a state transition by the state transition control mechanism, since a equal state signal is supplied when a required internal state has been transited. Consequently, the described semiconductor device and method for checking state transition may improve developing efficiencies to a large extent.

Other embodiments of the invention will be apparent to those skilled in the art from consideration of the specification and practice of the invention disclosed herein. It is intended that the specification and examples be considered as exemplary only, with a true scope and sprit of the invention being indicated by the following claims.

What is claimed is:

1. A semiconductor device, comprising:
   a state code register that stores a state code representing a present internal state;
   a state transition logic unit configured to determine a state code for a next internal state to be transited in accordance with a predetermined logic, based on a state code provided from the state code register and an input command instructing transition to a required state, and to set the determined state code into the state code register with synchronizing an internal clock;
   an expected value register configured to hold an internal state to be detected, as an expected value code; and
   a comparing unit that compares the state code set in the state code register by the state transition logic unit to the expected value code in the expected value register and supplying an equal state signal when they coincide.

2. The semiconductor device according to claim 1, further comprising:
   a timer unit configured to count a residence period at a present internal state with synchronizing to an internal clock;
   wherein the state transition logic unit is further configured to input a count value from the timer unit so that it further determines a state code for a next internal state to be transited based on the count value provided from the timer.

3. The semiconductor device according to claim 2, wherein:
   the timer unit stops or resets its counting operation by receiving the equal state signal from the comparing unit; and
   the state transition logic unit stops a transition of an internal state based on the count value supplied from the timer unit.

4. The semiconductor device according to claim 1, further comprising:
   an internal interrupt generating unit configured to generate and supply an internal interrupt command to the state transition logic unit by receiving the equal state signal provided from the comparing unit.

5. The semiconductor device according to claim 4, wherein:
   the internal interrupt generating unit, is further configured to receive a test command for selecting either one of a normal mode or a test mode and an interrupt command indicating an interrupt operation externally, so that it provides the interrupt command during the normal mode and provides the internal interrupt command during the test mode to the state transition logic unit.

6. The semiconductor device according to claim 4, further comprising a unit configured to inform the equal state signal externally.

7. A method for checking a state transition of a semiconductor device, comprising:
   determining a state code for a next internal state to be transited in accordance with a predetermined logic, based on a state code indicating a present internal state and a command instructing to transit to a required state;
   setting the determined state code into a state code register, with synchronizing an internal clock;
   setting an internal state to be detected into an expected value register as an expected value code;
   comparing the state code set into the state code register with the expected value code set into the expected value register; and
   outputting an equal state signal when the state code coincides with the expected value code.

8. The state transition checking method according to claim 7, further comprising determining the state code for a next internal state to be transited, based on a count value indicating a residence period at a present internal state.

9. The state transition checking method according to claim 7, further comprising prohibiting occurrence of a transition from a present internal state when the equal state signal is provided after the comparison, except transition to the predetermined internal state.

10. The state transition checking method according to claim 7, further comprising generating an internal interrupt command for transiting into a predetermined internal state when the equal state signal is supplied after the comparison.

11. The state transition checking method according to claim 7, further comprising utilizing the equal state signal after the comparison as an external trigger signal for evaluating or analyzing an internal state.

12. The state transition checking method according to claim 7, further comprising counting a residence period at a present internal state with synchronizing to an internal clock.

13. The state transition checking method according to claim 7, further comprising inputting a count value to further determine a state code for a next internal state to be transited.

14. The state transition checking method according to claim 7, further comprising stopping or resetting a counting operation by receiving the equal state signal.

15. The state transition checking method according to claim 7, further comprising stopping a transition of an internal state based on the count value supplied by a timer unit.

16. A semiconductor device, comprising:
   a state code register that stores a state code representing a present internal state;
   means for determining a state code for a next internal state to be transited in accordance with a predetermined logic, based on a state code provided from the state code register and an input command instructing transition to a required state, and setting the determined state code into the state code register with synchronizing an internal clock;
   an expected value register configured to hold an internal state to be detected, as an expected value code; and
   a comparing unit that compares the state code set in the state code register by the means for determining the expected value code in the expected value register and supplying an equal state signal when they coincide.

17. The semiconductor device according to claim 16, further comprising:
   a timer unit configured to count a residence period at a present internal state with synchronizing to an internal clock;
   wherein the means for determining further inputs a count value from the timer unit so that it further determines a state code for a next internal state to be transited based on the count value provided from the timer.

18. The semiconductor device according to claim 17, wherein:
   the timer unit stops or resets its counting operation by receiving the equal state signal from the comparing unit; and
   the means for determining stops a transition of an internal state based on the count value supplied from the timer unit.

19. The semiconductor device according to claim 16, further comprising:
   an internal interrupt generating unit configured to generate and supply an internal interrupt command to the means for determining by receiving the equal state signal provided from the comparing unit.

20. The semiconductor device according to claim 19, further comprising a unit configured to inform the equal state signal externally.

* * * * *